(12) United States Patent
Yu et al.

(10) Patent No.: US 9,054,710 B2
(45) Date of Patent: Jun. 9, 2015

(54) TOUCH KEYBOARD WITH IMPROVED STRUCTURE

(71) Applicant: Paragon Technologies Co., Ltd., Taoyuan County (TW)

(72) Inventors: Ching-Feng Yu, Taoyuan (TW); Pin-Feng Hung, Taoyuan (TW)

(73) Assignee: PARAGON TECHNOLOGIES CO., LTD., Gueishan Township, Taoyuan County (TW)

( * ) Notice: Subject to any disclaimer, the term of this patent is extended or adjusted under 35 U.S.C. 154(b) by 207 days.

(21) Appl. No.: 13/836,288

(22) Filed: Mar. 15, 2013

(65) Prior Publication Data

US 2014/0262721 A1   Sep. 18, 2014

(51) Int. Cl.
*H03M 11/00* (2006.01)
*H03K 17/96* (2006.01)

(52) U.S. Cl.
CPC .. *H03K 17/9622* (2013.01); *H03K 2217/96038* (2013.01)

(58) Field of Classification Search
None
See application file for complete search history.

(56) References Cited

U.S. PATENT DOCUMENTS 6,037,882 A * 3/2000 Levy ............................... 341/20

FOREIGN PATENT DOCUMENTS

TW         M417605 U      12/2011

* cited by examiner

*Primary Examiner* — Travis Hunnings
(74) *Attorney, Agent, or Firm* — Muncy, Geissler, Olds & Lowe, P.C.

(57) ABSTRACT

A touch keyboard with an improved structure is disclosed. The touch keyboard includes a keyboard casing and an inductive circuit layer. The keyboard casing has a front surface and a rear surface; the front surface has a keyboard key assembly composed of a plurality of touch keyboard keys. The touch keyboard keys are integrally formed with the keyboard casing and projected from the front surface of the keyboard casing. The inductive circuit layer is formed on the rear surface of the keyboard casing and is used to detect touching and sliding operations from the user. The touch keyboard keys are projected from the front surface of the keyboard casing so as to identify positions of the touch keyboard keys without fixing user's eyes on the keyboard and increase touching feeling.

18 Claims, 8 Drawing Sheets

TOUCH KEYBOARD WITH IMPROVED STRUCTURE

BACKGROUND

1. Technical Field

The present disclosure relates generally to a keyboard, and more particularly to a touch keyboard with an improved structure.

2. Description of Related Art

With the development of the science and technology, many electronic devices are produced toward the trend of light, thin, short, and small so that users can conveniently carry and use the electronic devices. In addition, peripheral devices connected to the electronic devices are also produced toward the trend of light, thin, short, and small so as to reduce the additional occupied space and easily to be stored.

The electronic device is usually communicated with the external device by operating a touch keyboard which is rectangle or rectangle-like and composed of a plurality of touch keyboard keys, and each touch keyboard keys has at least one character thereon. When one of the touch keyboard keys is pressed, a corresponding text, number, or symbol is displayed. Because the pressed distance is related with the thickness of the touch keyboard, collision and friction noises would be produced when the touch keyboard keys are pressed. A touch keyboard with an improved structure according to the present disclosure can provide a thin touch keyboard so as to significantly reduce collision and friction noises.

At present, the most of the commercial touch keyboards have the flat surfaces of the touch keyboard keys. The user has to touch the touch keyboard keys with fingers with user's eyes on the keyboard so as to find and identify the desired touch keyboard keys. Accordingly, it is not convenient for the user to operate the touch keyboard in the environment that the light is insufficient.

SUMMARY

An object of the present disclosure is to provide a touch keyboard with an improved structure to solve the above-mentioned problems. The touch keyboard provides protruding touch keyboard keys, protruding pattern layers, and protruding portions on surfaces of the touch keyboard keys. Accordingly, the user can touch the protruding touch keyboard keys with fingers so as to quickly find and identify the desired touch keyboard keys without fixing user's eyes on the keyboard.

Another object of the present disclosure is to provide a touch keyboard with an improved structure to solve the above-mentioned problems. The touch keyboard provides a mouse operation mode so that the user can slide finger(s) along a sliding track on the top surfaces of the touch keyboard keys to switch the keyboard key mode and the mouse operation mode. The information of the sliding track, such as sliding length, sliding distance, sliding direction, or sliding time can be detected to control movement of the cursor by the computer. In addition, because each touch keyboard key has at least one round corner on an edge thereof and the preferred protrusion height of each touch keyboard key is less than or equal to 0.2 millimeters, the sliding feeling is more smooth. Furthermore, a wired module or a wireless module, such as Bluetooth module or RF module is provided to connect to an external device.

In order to achieve the above-mentioned object of the present disclosure, a touch keyboard with an improved structure is provided. The touch keyboard includes a keyboard casing and an inductive circuit layer. The keyboard casing has a front surface and a rear surface, the front surface has a keyboard key assembly composed of a plurality of touch keyboard keys. The touch keyboard keys are integrally formed with the keyboard casing and projected from the front surface of the keyboard casing. The inductive circuit layer is formed on the rear surface of the keyboard casing and is used to detect touching and sliding operations from the user. The touch keyboard keys are projected from the front surface of the keyboard casing so as to identify positions of the touch keyboard keys and increase touching feeling.

Wherein the keyboard casing is made of a hard or soft plastic material;

Wherein the preferred protrusion height of each touch keyboard key is less than or equal to 0.2 millimeters;

Wherein each touch keyboard key has at least one round corner on an edge thereof;

Wherein each touch keyboard key has a top surface and a pattern layer is formed on the top surface;

Wherein the pattern layer is any one of texts, numbers, or symbols;

Wherein the inductive circuit layer is a capacitive inductive circuit layer;

Wherein the preferred thickness of the inductive circuit layer is less than or equal to 0.1 millimeters;

Wherein a bottom cover is installed at a bottom of the keyboard casing;

Wherein a circuit board is installed between the keyboard casing and the bottom cover, the circuit board is electrically connected to the inductive circuit layer to receive induction signals outputted from the inductive circuit layer; the circuit board has a wired module or a wireless module and the circuit hoard is electrically connected to an external device via the wired module or the wireless module; the induction signals are transmitted to the external device via the wired module or the wireless module.

In order to achieve the above-mentioned object of the present disclosure, a touch keyboard with an improved structure is provided. The touch keyboard includes a keyboard casing and an inductive circuit layer. The keyboard casing has a front surface and a rear surface, the front surface has a keyboard key assembly composed of a plurality of touch keyboard key graphs, each touch keyboard key graph has a top surface and a pattern layer is formed and projected on the top surface. The inductive circuit layer is formed on the rear surface of the keyboard casing and is used to detect touching and sliding operations from the user. The projected pattern layer is configured to identify positions of the touch keyboard keys and increase touching feeling.

Wherein the keyboard casing is made of a hard or soft plastic material;

Wherein the preferred protrusion height of each pattern layer is less than or equal to 0.2 millimeters;

Wherein the pattern layer is any one of texts, numbers, or symbols;

Wherein the inductive circuit layer is a capacitive inductive circuit layer;

Wherein the preferred thickness of the inductive circuit layer is less than or equal to 0.1 millimeters;

Wherein a bottom cover is installed at a bottom of the keyboard casing;

Wherein a circuit board is installed between the keyboard casing and the bottom cover, the circuit board is electrically connected to the inductive circuit layer to receive induction signals outputted from the inductive circuit layer; the circuit board has a wired module or a wireless module and the circuit board is electrically connected to an external device via the wired module or the wireless module; the induction signals are transmitted to the external device via the wired module or the wireless module.

In order to achieve the above-mentioned object of the present disclosure, a touch keyboard with an improved structure is provided. The touch keyboard includes a keyboard casing and an inductive circuit layer. The keyboard casing has a front surface and a rear surface, the front surface has a keyboard key assembly composed of a plurality of touch keyboard key graphs, at least one protruding portion is arranged between any two of the touch keyboard graphs. The inductive circuit layer formed on the rear surface of the keyboard casing and is used to detect touching and sliding operations from the user. The protruding portions are projected from the front surface of the keyboard casing so as to identify distributed positions of the touch keyboard key graphs and increase touching feeling.

Wherein the keyboard casing is made of a hard or soft plastic material;

Wherein the preferred protrusion height of each protruding portion is less than or equal to 0.2 millimeters;

Wherein each touch keyboard key graph has a top surface and a pattern layer is formed on the top surface;

Wherein the pattern layer is any one of texts, numbers, or symbols;

Wherein the inductive circuit layer is a capacitive inductive circuit layer;

Wherein the preferred thickness of the inductive circuit layer is less than or equal to 0.1 millimeters;

Wherein a bottom cover is installed at a bottom of the keyboard casing;

Wherein a circuit board is installed between the keyboard casing and the bottom cover, the circuit board is electrically connected to the inductive circuit layer to receive induction signals outputted from the inductive circuit layer; the circuit board has a wired module or a wireless module and the circuit board is electrically connected to an external device via the wired module or the wireless module; the induction signals are transmitted to the external device via the wired module or the wireless module.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION

Figure 1:
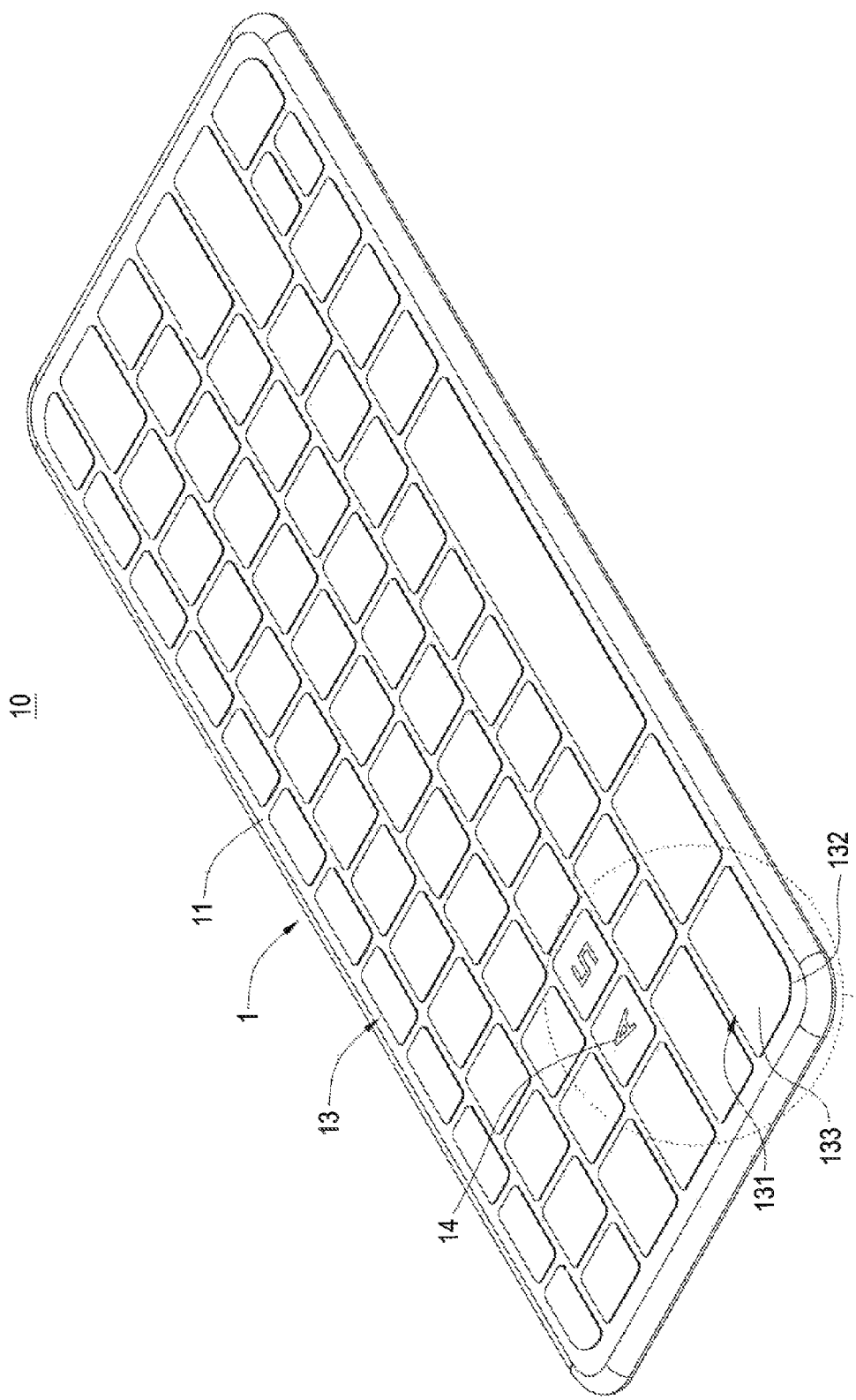
FIG. 1 is a perspective schematic view of a touch keyboard according to the present disclosure.

Reference will now be made to the drawing figures to describe the present invention in detail.

Figure 2:
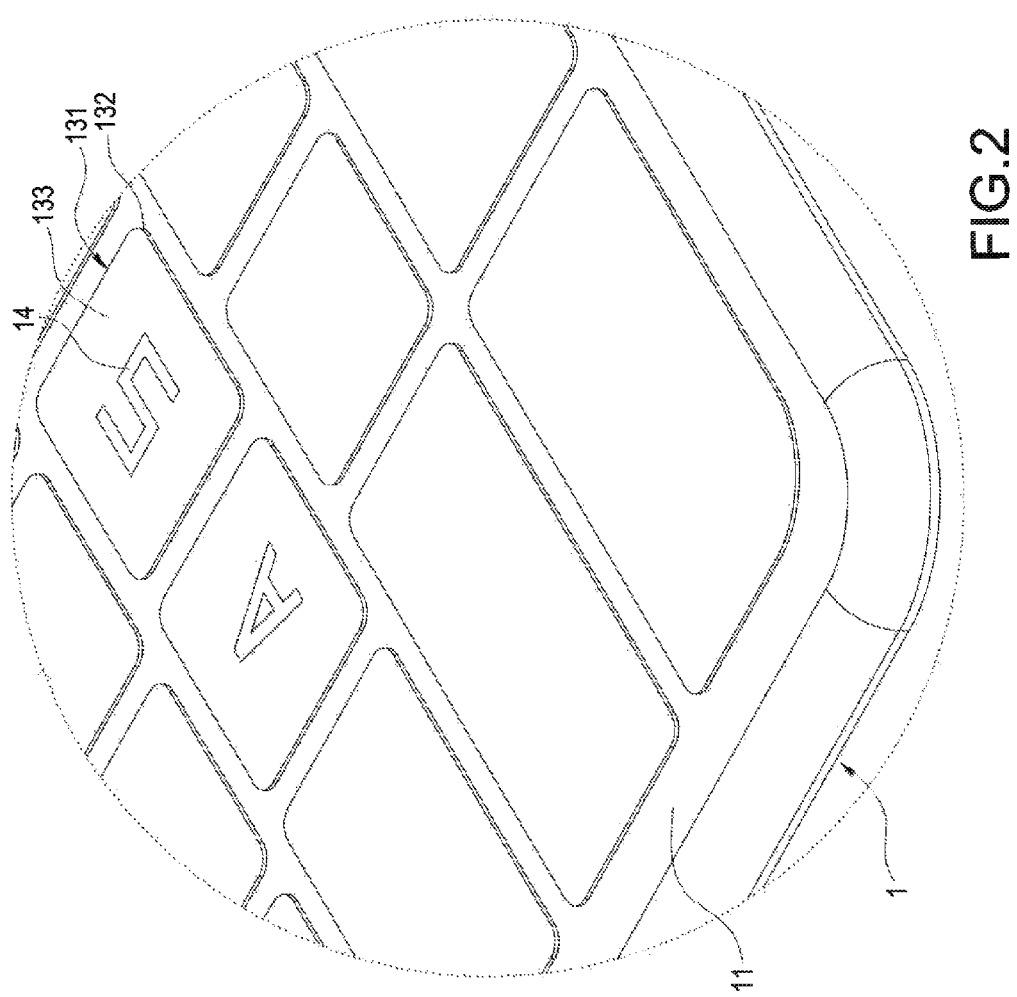
FIG. 2 is a schematic front view of the touch keyboard according to the present disclosure.
Figure 3:
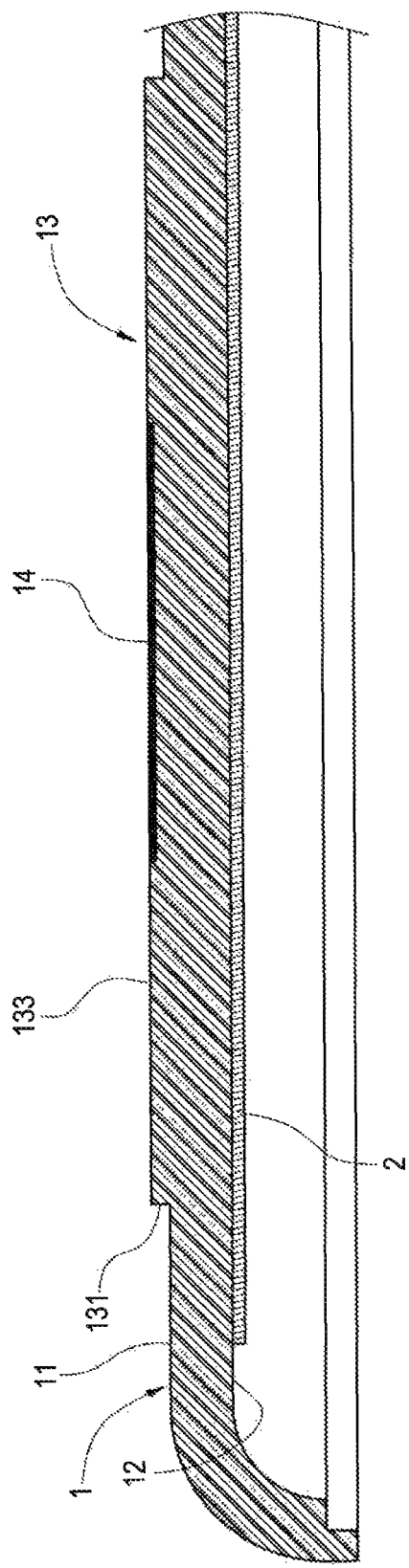
FIG. 3 is a schematic cross-sectional view of the touch keyboard according to the present disclosure.

Reference is made to FIG. 1, FIG. 2, and FIG. 3 which are a perspective view of a touch keyboard with an improved structure, a front view of a touch keyboard with an improved structure, and a cross-sectional view taken along line 3-3 in FIG. 2, respectively. The keyboard structure 10 includes a keyboard casing 1 and an inductive circuit layer 2.

The keyboard casing 1 is made of a hard or soft plastic material, which has a front surface 11 and a rear surface 12. The front surface 11 has a keyboard key assembly 13 thereon and the keyboard key assembly 13 composed of a plurality of touch keyboard keys 131. The touch keyboard keys 131 are integrally formed with the keyboard casing 1 and projected from the front surface 11 of the keyboard casing 1. The preferred protrusion height of each touch keyboard key 131 is less than or equal to 0.2 millimeters so as to increase touching feeling and indicate the relative position of the touch keyboard keys 131. Each touch keyboard key 131 has at least one round corner 132 on an edge thereof so as to smooth touching feeling on the front surface 11. Each touch keyboard key 131 has a top surface 133 and a pattern layer 14 is formed on the top surface 133, and the pattern layers 14 are provided to indicate functions of the corresponding touch keyboard keys 131. In the present disclosure, the pattern layer 14 can be any one of the texts, numbers, or symbols (including arrows or punctuation marks).

The inductive circuit layer 2 is a thin-film capacitive inductive circuit layer and sputtered on the rear surface 12 of the keyboard casing 1. The preferred thickness of the inductive circuit layer 2 is less than or equal to 0.1 millimeters.

Figure 4:
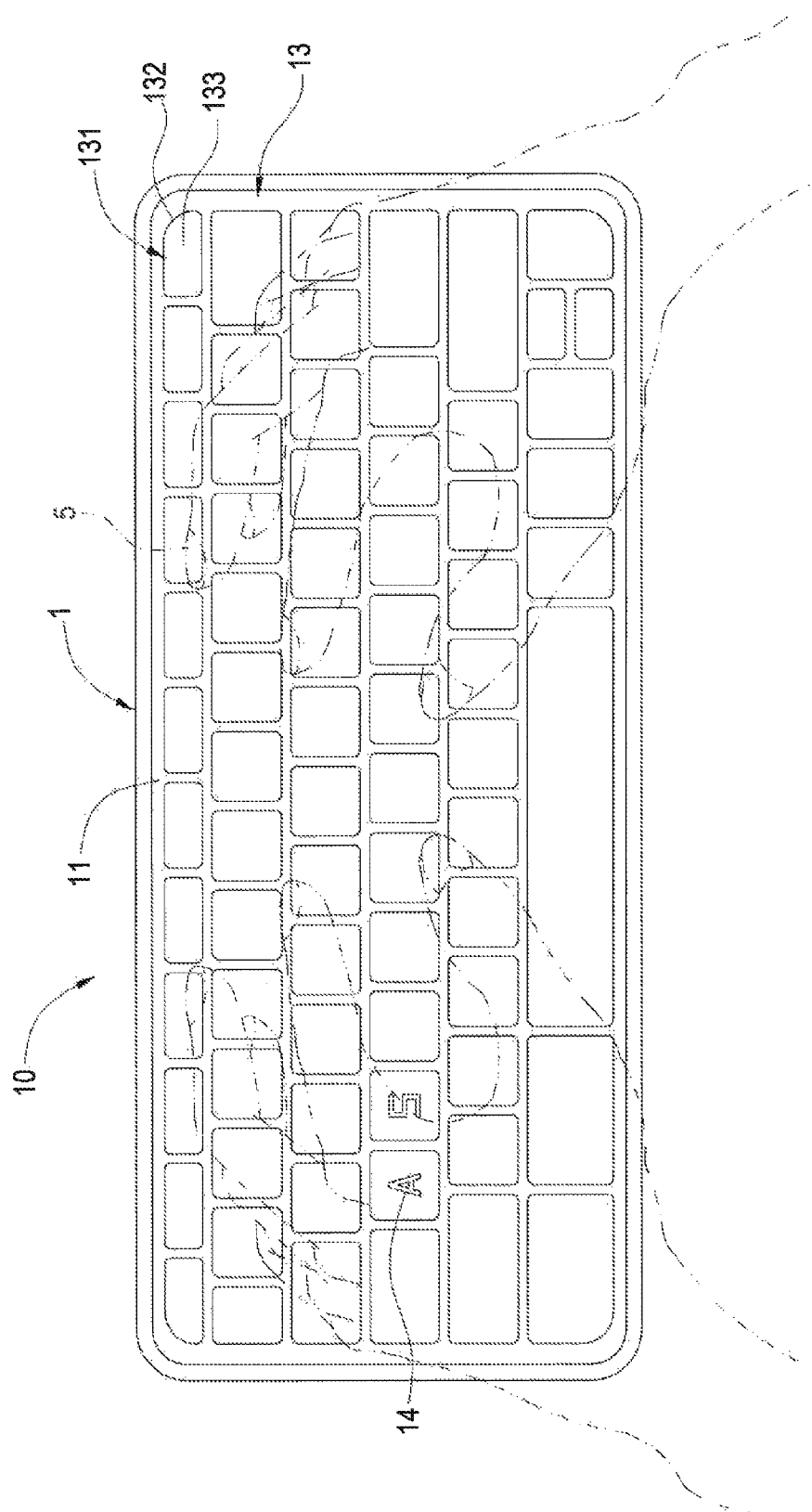
FIG. 4 is a schematic view of status of using the touch keyboard according to the present disclosure.

Reference is made to FIG. 3 and FIG. 4 which are a schematic cross-sectional view of the touch keyboard and a schematic view of status of using the touch keyboard according to the present disclosure, respectively. When the user touches the protruding touch keyboard keys 131 with fingers 5, the user can quickly find and identify the desired touch keyboard keys 131 without fixing user's eyes on the keyboard. In addition, when the keyboard is used in the environment that the light is insufficient, the protruding touch keyboard keys 131 can help the user quickly and easily find the desired touch keyboard keys and increase touching feeling.

When the user ouches the top surfaces 133 of the touch keyboard keys 131, the inductive circuit layer 2 can detect the touch operations and then produce induction signals. The induction signals are transmitted to the circuit board (not shown) and then transmitted to the computer to be processed. Also, the induction signals can be transmitted to the computer to be processed and then information of the touch operations is displayed on the computer.

Figure 5:
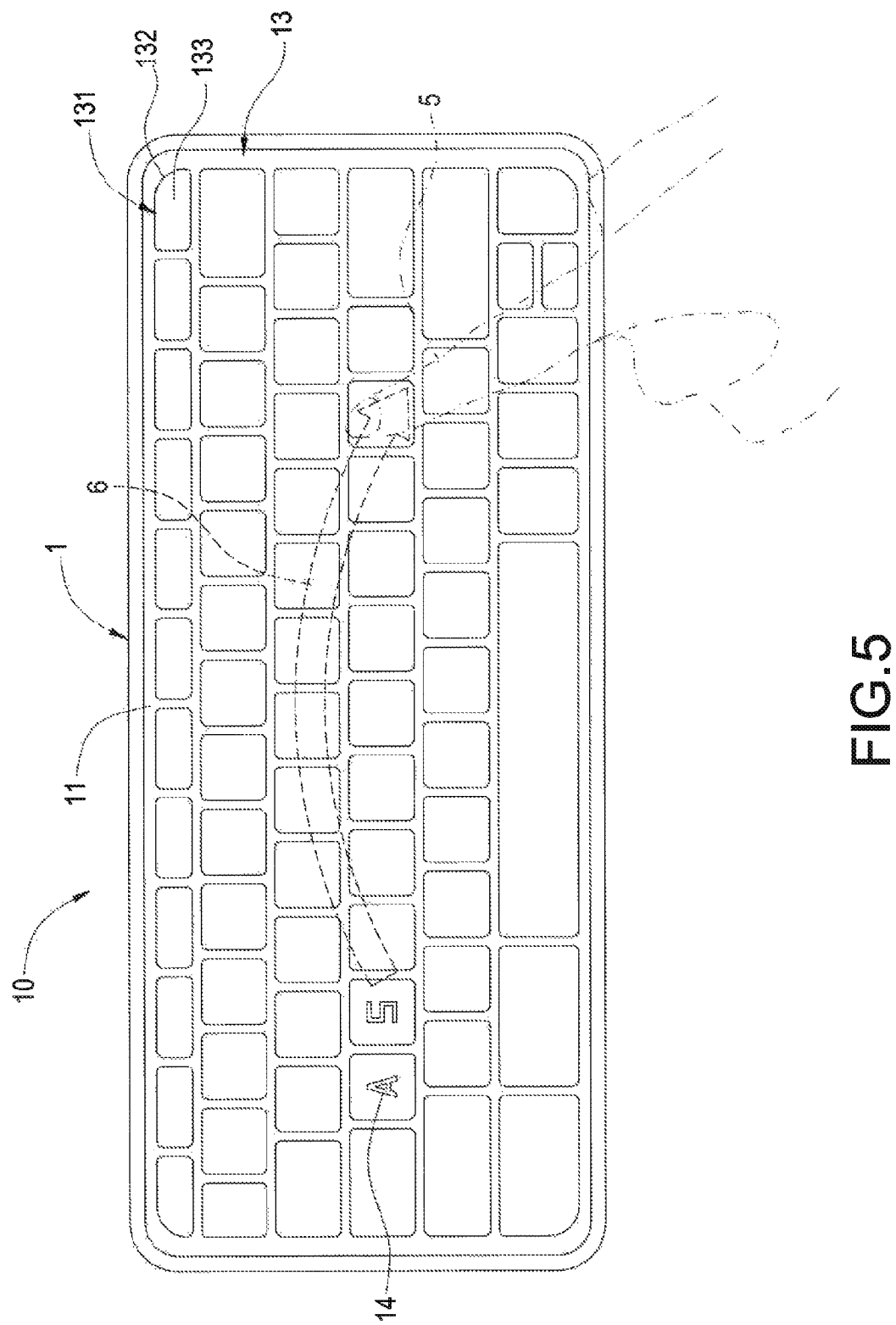
FIG. 5 is another schematic view of status of using the touch keyboard according to the present disclosure.

Reference is made to FIG. 5 which is another schematic view of status of using the touch keyboard according to the present disclosure. After finishing operations of the touch keyboard keys 131 of the keyboard structure 10, the user can touch one or more than one touch keyboard keys 131 or slide finger(s) along a sliding track 6 on the top surfaces 133 of the touch keyboard keys 131 to switch to a mouse operation mode. Especially, information of the sliding track 6, such as sliding length, sliding distance, sliding direction, or sliding time can be detected to control movement of the cursor by the computer.

For example, the user can slide finger(s) along the sliding track 6, such as a line track or a geometric track to switch the touch keyboard key mode and the mouse operation mode. Also, the user can touch one or more than one touch keyboard keys 131 to switch the touch keyboard key mode and the mouse operation mode.

Figure 6:
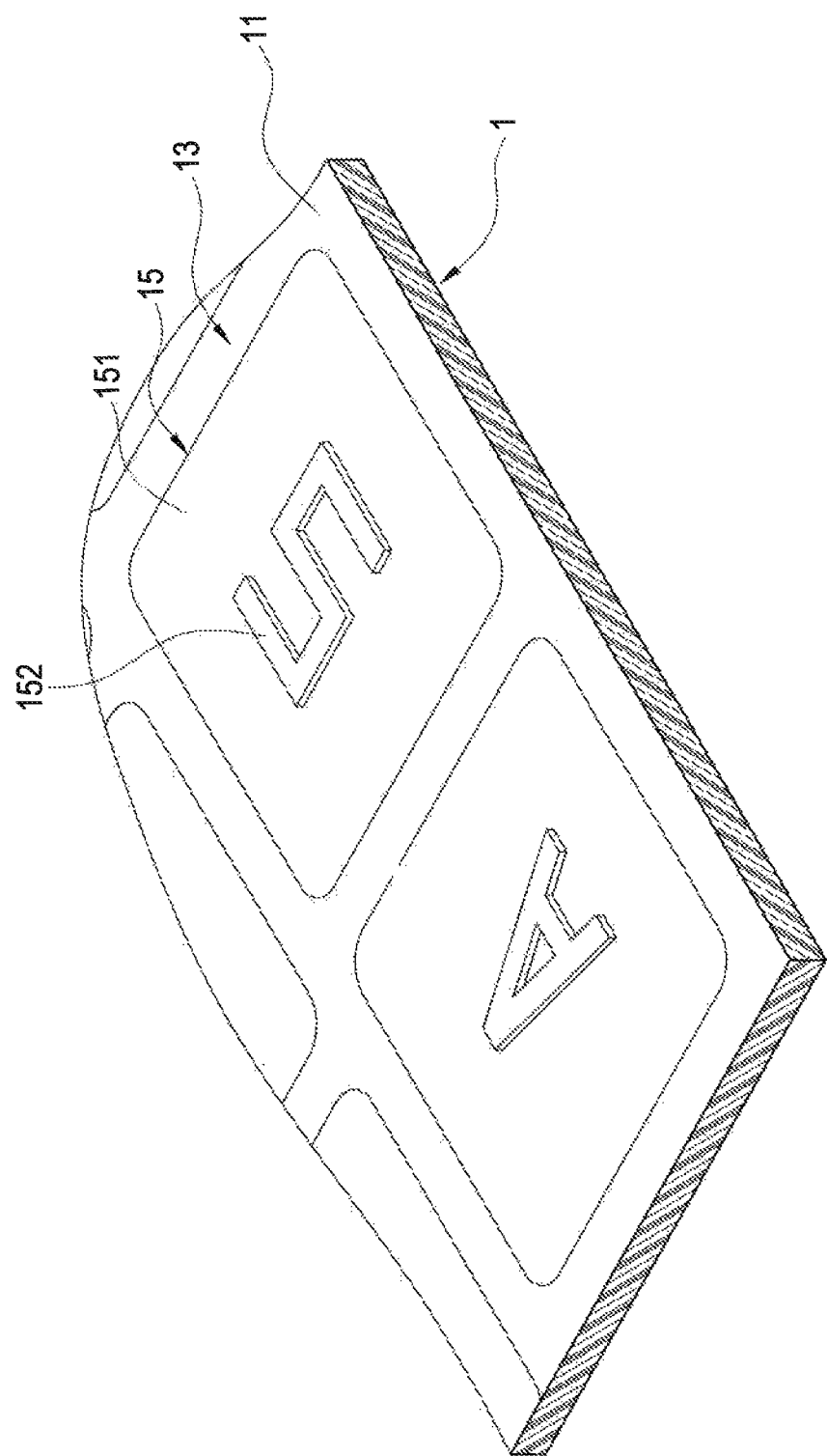
FIG. 6 is a schematic view of another embodiment according to the present disclosure.

Reference is made to FIG. 6 which is a schematic view of another embodiment according to the present disclosure. In this embodiment, the keyboard key assembly 13 on the front surface 11 is composed of a plurality of touch keyboard graphs 15. Each of the touch keyboard graphs 15 has a top surface 151 and a pattern layer 152 is formed and projected on the top surface 151 of the touch keyboard key graph 15. The protruding pattern layers 152 can help the user find the relative position of the touch keyboard graphs 15 without fixing user's eyes on the keyboard. In addition, when the keyboard is used in the environment that the light is insufficient, the protruding pattern layers 152 can help the user quickly and easily find the desired touch keyboard keys and increase touching feeling. As shown in FIG. 6, the protrusion height of each protruding pattern layer 152 is less than or equal to 0.2 millimeters and each protruding pattern layer 152 can be any one of the texts, numbers, or symbols (including arrows or punctuation marks).

Figure 7:
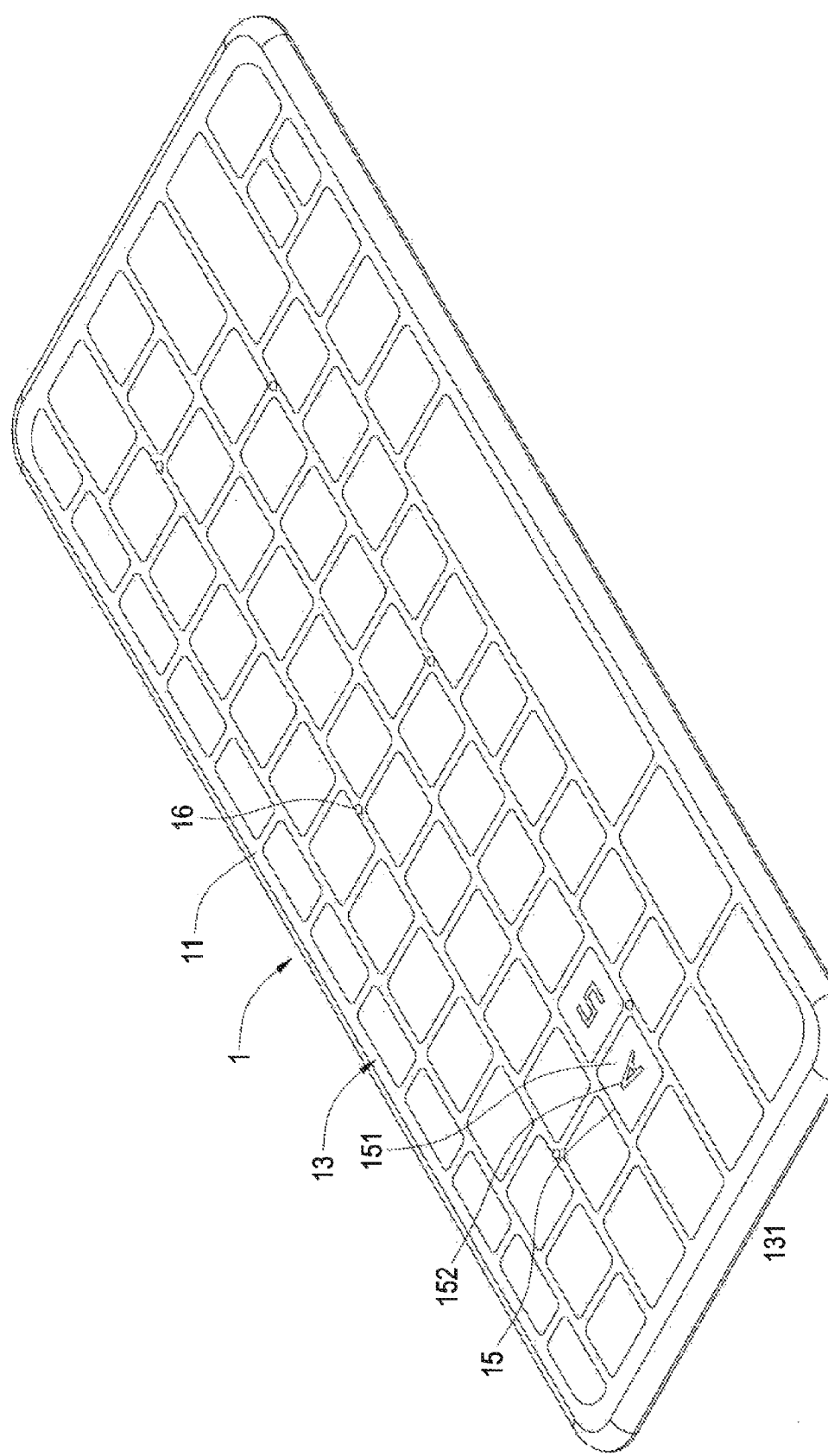
FIG. 7 is a schematic view of further another embodiment according to the present disclosure.

Reference is made to FIG. 7 which is a schematic view of further another embodiment according to the present disclosure. In this embodiment, the keyboard has a plurality of protruding portions 16 which are arranged between any two of the touch keyboard graphs 15 and each of the protruding portions has an arc surface. The protruding portions 16 can help the user identify the distributed position of the touch keyboard graphs 15 without fixing user's eyes on the keyboard. In addition, when the keyboard is used in the environment that the light is insufficient, the protruding portions 16 can help the user quickly and easily find the desired touch keyboard keys and increase touching feeling. As shown in FIG. 7, the protrusion height of each protruding portion 16 is less than or equal to 0.2 millimeters.

Figure 8:
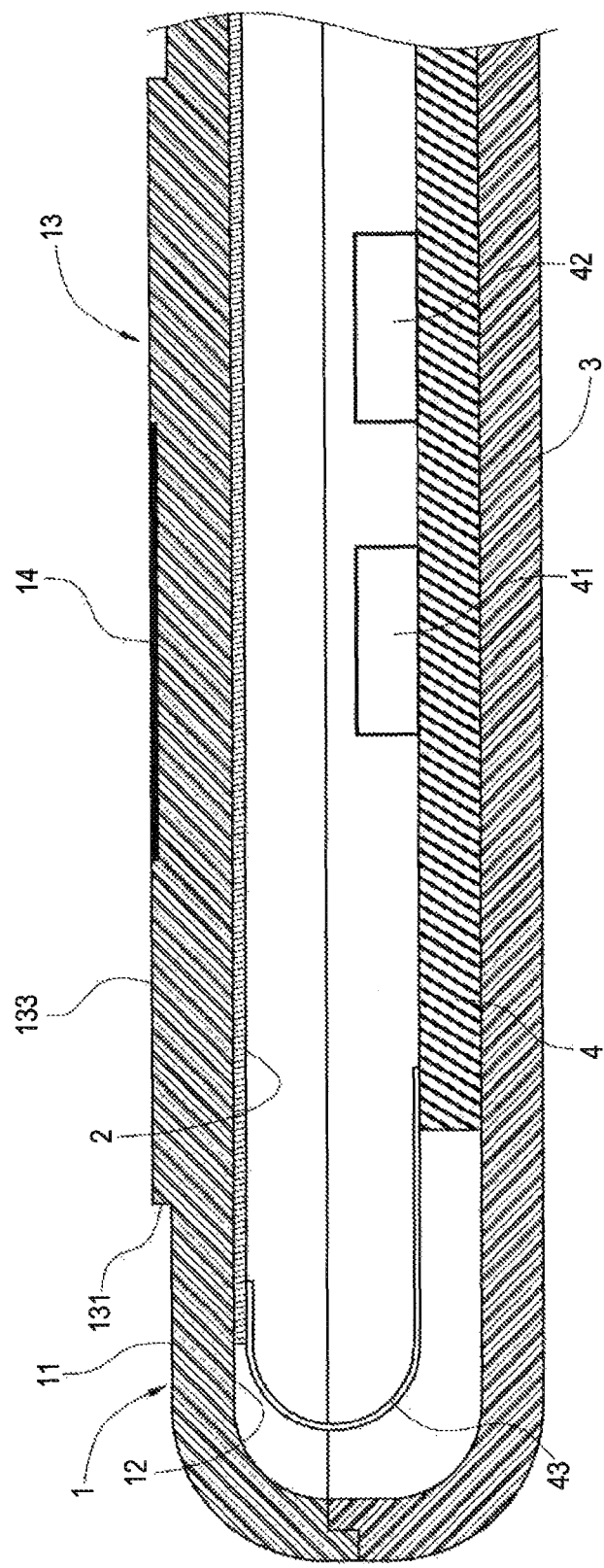
FIG. 8 is a schematic view of further another embodiment according to the present disclosure.

Reference is made to FIG. 8 which is a schematic view of further another embodiment according to the present disclosure. In this embodiment, after the manufacture of the keyboard casing 1 is completed, a bottom cover 3 is installed at a bottom of the keyboard casing 1. The bottom cover 3 is used to protect the inductive circuit layer 2 which is a thin film and sputtered on a rear surface of the keyboard casing 1. In addition, a circuit board 4 is installed between the keyboard casing 1 and the bottom cover 3. The circuit board 4 is electrically connected to the inductive circuit layer 2 via a thin-film printed circuit board 43 to receive induction signals outputted from the inductive circuit layer 2. Furthermore, the circuit board 4 additionally has a wired module 41 or a wireless module 42, such as Bluetooth module or RF module, and the circuit board 4 is electrically connected to an external device via the wired module 41 or the wireless module 42 so that the induction signals are processed by the wired module 41 or the wireless module 42 and then transmitted to the external device to be processed or displayed.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A touch keyboard with an improved structure, comprising:
   a keyboard casing having a front surface and a rear surface, the front surface having a keyboard key assembly composed of a plurality of touch keyboard keys, the touch keyboard keys integrally formed with the keyboard casing and projected from the front surface of the keyboard casing; and
   an inductive circuit layer formed on the rear surface of the keyboard casing;
   wherein the touch keyboard keys are projected from the front surface of the keyboard casing so as to identify positions of the touch keyboard keys and increase touching feeling, wherein protrusion height of each touch keyboard key is less than or equal to 0.2 millimeters, wherein the inductive circuit layer is configured to detect touching and sliding operations, in which a touching object slides on top surfaces of a plurality of the touch keyboard keys, and the touch keyboard is switched to mouse mode when the sliding operations are detected.

2. The touch keyboard in claim 1, wherein the keyboard casing is made of a hard or soft plastic material.

3. The touch keyboard in claim 2, wherein each touch keyboard key has at least one round corner on an edge thereof, each touch keyboard key has a top surface and a pattern layer is formed on the top surface, and the pattern layer is any one of texts, numbers, or symbols.

4. The touch keyboard in claim 3, wherein the inductive circuit layer is a capacitive inductive circuit layer.

5. The touch keyboard in claim 4, wherein thickness of the inductive circuit layer is less than or equal to 0.1 millimeters.

6. The touch keyboard in claim 5, further comprising:
   a bottom cover installed at a bottom of the keyboard casing.

7. The touch keyboard in claim 6, further comprising:
   a circuit board installed between the keyboard casing and the bottom cover; wherein the circuit board is electrically connected to the inductive circuit layer to receive induction signals outputted from the inductive circuit layer; the circuit board has a wired module or a wireless module and the circuit board is electrically connected to an external device via the wired module or the wireless module; the induction signals are transmitted to the external device via the wired module or the wireless module.

8. A touch keyboard with an improved structure, comprising:
   a keyboard casing having a front surface and a rear surface, the front surface having a keyboard key assembly composed of a plurality of touch keyboard key graphs, each touch keyboard key graph having a top surface and a pattern layer is formed and projected on the top surface; and
   an inductive circuit layer formed on the rear surface of the keyboard casing;
   wherein the projected pattern layer is configured to identify positions of the touch keyboard keys and increase touching feeling, wherein protrusion height of each touch keyboard key is less than or equal to 0.2 millimeters, wherein the inductive circuit layer is configured to detect touching and sliding operations, in which a touching object slides on top surfaces of a plurality of the touch keyboard keys, and the touch keyboard is switched to mouse mode when the sliding operations are detected.

9. The touch keyboard in claim 8, wherein the keyboard casing is made of a hard or soft plastic material.

10. The touch keyboard in claim 9, wherein the pattern layer is any one of texts, numbers, or symbols.

11. The touch keyboard in claim 10, wherein the inductive circuit layer is a capacitive inductive circuit layer, and thickness of the inductive circuit layer is less than or equal to 0.1 millimeters.

12. The touch keyboard in claim 11, further comprising:
a bottom cover installed at a bottom of the keyboard casing.

13. The touch keyboard in claim 12, further comprising:
a circuit board installed between the keyboard casing and the bottom cover; wherein the circuit board is electrically connected to the inductive circuit layer to receive induction signals outputted from the inductive circuit layer; the circuit board has a wired module or a wireless module and the circuit board is electrically connected to an external device via the wired module or the wireless module; the induction signals are transmitted to the external device via the wired module or the wireless module.

14. A touch keyboard with an improved structure, comprising:
a keyboard casing having a front surface and a rear surface, the front surface having a keyboard key assembly composed of a plurality of touch keyboard key graphs, at least one protruding portion is arranged between any two of the touch keyboard graphs; and
an inductive circuit layer formed on the rear surface of the keyboard casing;
wherein the protruding portions are projected from the front surface of the keyboard casing so as to identify distributed positions of the touch keyboard key graphs and increase touching feeling, wherein protrusion height of each protruding portion is less than or equal to 0.2 millimeters, wherein the inductive circuit layer is configured to detect touching and sliding operations, in which a touching object slides on top surfaces of a plurality of the touch keyboard keys, and the touch keyboard is switched to mouse mode when the sliding operations are detected.

15. The touch keyboard in claim 14, wherein the keyboard casing is made of a hard or soft plastic material.

16. The touch keyboard in claim 15, wherein each touch keyboard key graph has a top surface and a pattern layer is formed on the top surface, and the pattern layer is any one of texts, numbers, or symbols.

17. The touch keyboard in claim 16, wherein the inductive circuit layer is a capacitive inductive circuit layer, and thickness of the inductive circuit layer is less than or equal to 0.1 millimeters.

18. The touch keyboard in claim 17, further comprising:
a bottom cover installed at a bottom of the keyboard casing; and
a circuit board installed between the keyboard casing and the bottom cover; wherein the circuit board is electrically connected to the inductive circuit layer to receive induction signals outputted from the inductive circuit layer; the circuit board has a wired module or a wireless module and the circuit board is electrically connected to an external device via the wired module or the wireless module; the induction signals are transmitted to the external device via the wired module or the wireless module.

* * * * *